(12) United States Patent
Baba et al.

(10) Patent No.: US 9,960,471 B2
(45) Date of Patent: May 1, 2018

(54) TRANSMISSION LINE

(71) Applicant: Murata Manufacturing Co., Ltd., Nagaokakyo-shi, Kyoto-fu (JP)

(72) Inventors: Takahiro Baba, Nagaokakyo (JP); Satoshi Sasaki, Nagaokakyo (JP); Kuniaki Yosui, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 16 days.

(21) Appl. No.: 15/361,604

(22) Filed: Nov. 28, 2016

(65) Prior Publication Data

US 2017/0077579 A1 Mar. 16, 2017

Related U.S. Application Data

(63) Continuation of application No. PCT/JP2015/064684, filed on May 22, 2015.

(30) Foreign Application Priority Data

Jun. 2, 2014 (JP) .................................. 2014-113668

(51) Int. Cl.
*H01P 3/08* (2006.01)
*H05K 1/02* (2006.01)

(52) U.S. Cl.
CPC ................ *H01P 3/08* (2013.01); *H01P 3/082* (2013.01); *H05K 1/02* (2013.01)

(58) Field of Classification Search
CPC .. H01P 3/08; H01P 3/081; H01P 3/082; H01P 3/085; H01P 3/088

USPC .............................. 333/1, 4, 5, 33, 238, 246
See application file for complete search history.

(56) References Cited

U.S. PATENT DOCUMENTS

2006/0139117 A1 6/2006 Brunker et al.
2012/0097433 A1 4/2012 Kato et al.

FOREIGN PATENT DOCUMENTS

| JP | 2003-188609 A | 7/2003 |
| JP | 2009-124044 A | 6/2009 |
| JP | 4962660 B2 | 6/2012 |

OTHER PUBLICATIONS

Official Communication issued in corresponding International Application PCT/JP2015/064684, dated Aug. 11, 2015.

*Primary Examiner* — Stephen E Jones
(74) *Attorney, Agent, or Firm* — Keating & Bennett, LLP

(57) ABSTRACT

In a transmission line, first and second signal conductors are located inside a dielectric base body. The first and second signal conductors are located between first and second ground conductors in a thickness direction of the dielectric base body. A main conductor portion of the second ground conductor is located between the first and second signal conductors in a width direction of the dielectric base body. First and second auxiliary conductor portions of the second ground conductor respectively extend from the main conductor portion to first-signal-conductor-side and second-signal-conductor-side lateral surfaces of the dielectric base body. A first lateral-surface conductor connects the first auxiliary conductor portion to a plating-connection conductor connected to the first ground conductor. A second lateral-surface conductor connects the second auxiliary conductor portion to a plating-connection conductor connected to the first ground conductor.

14 Claims, 6 Drawing Sheets

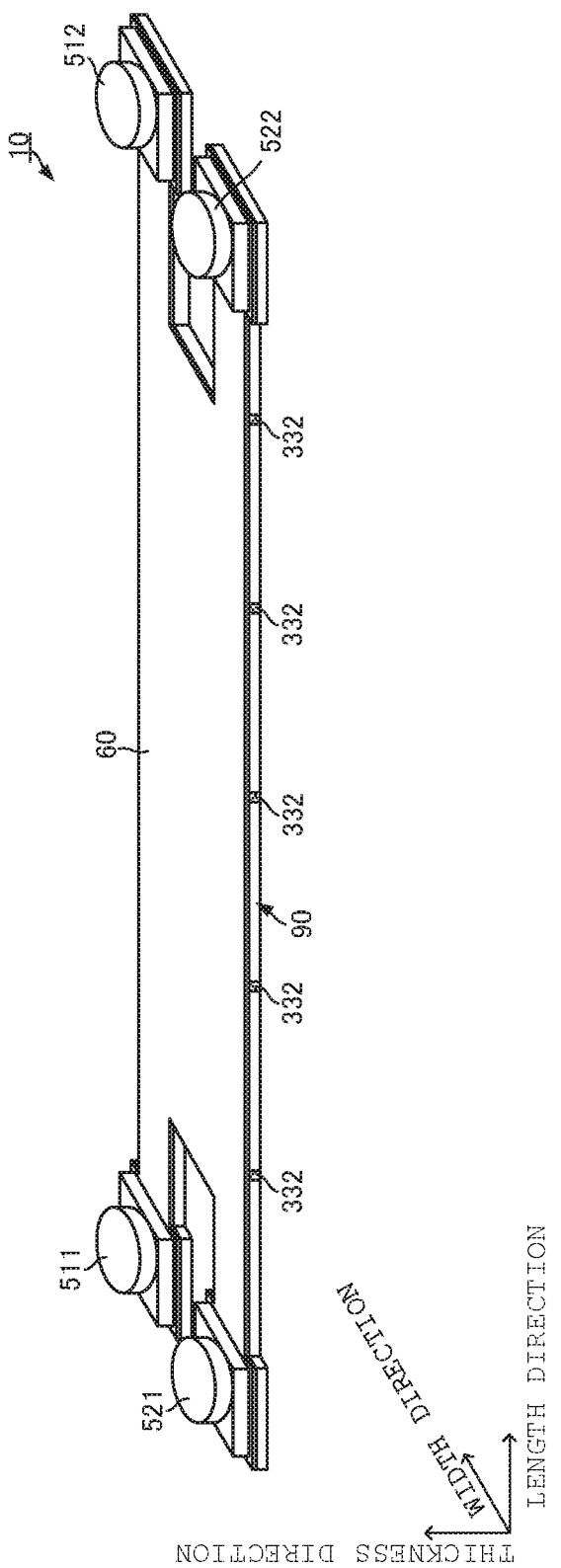

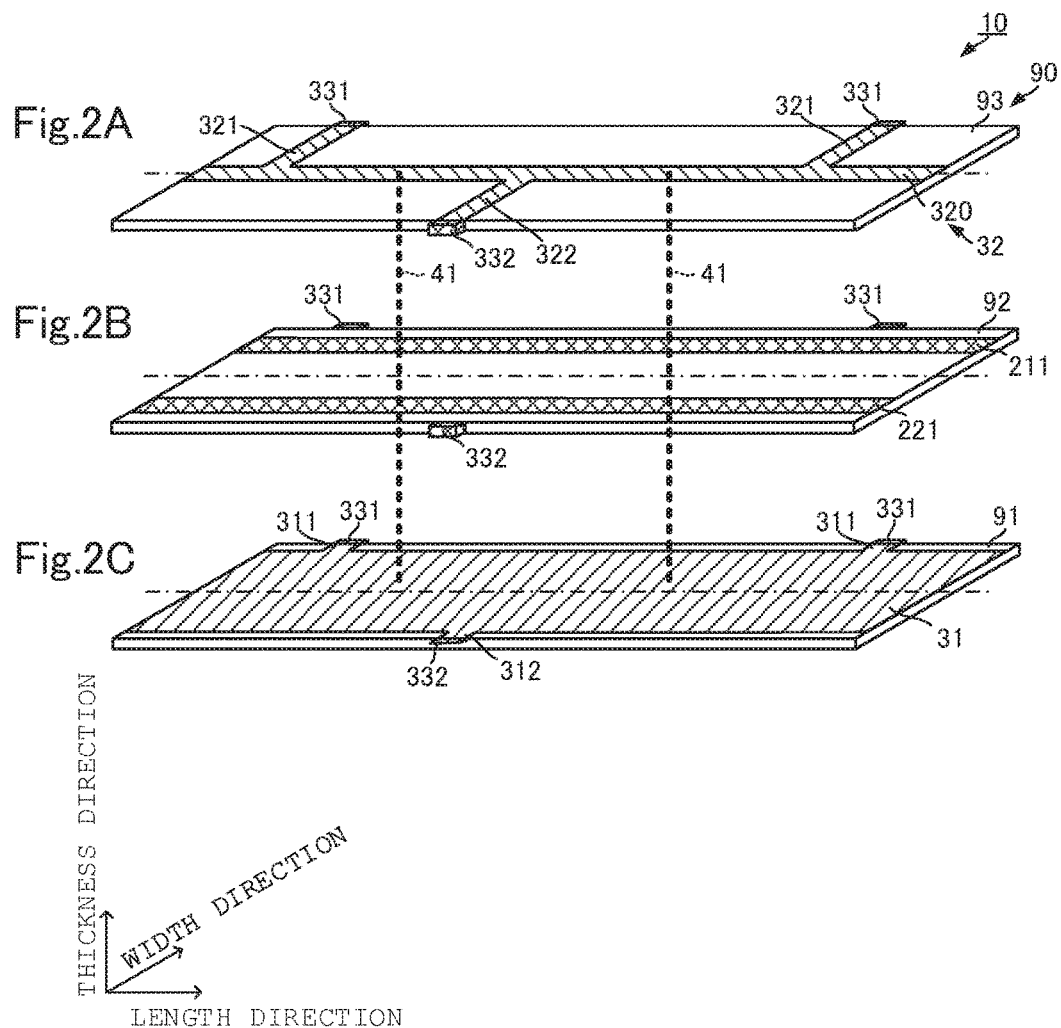

WIDTH DIRECTION

LENGTH DIRECTION

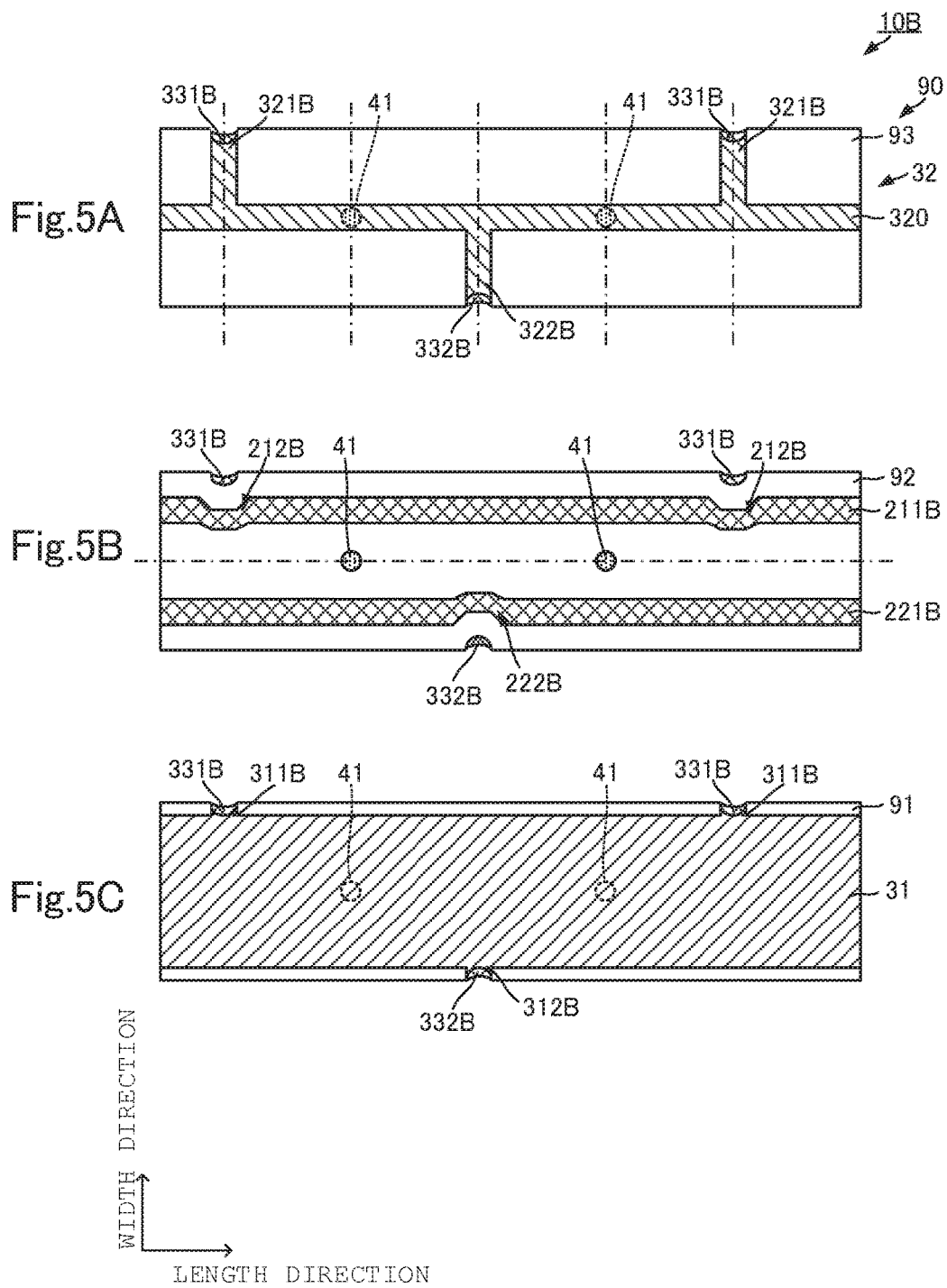

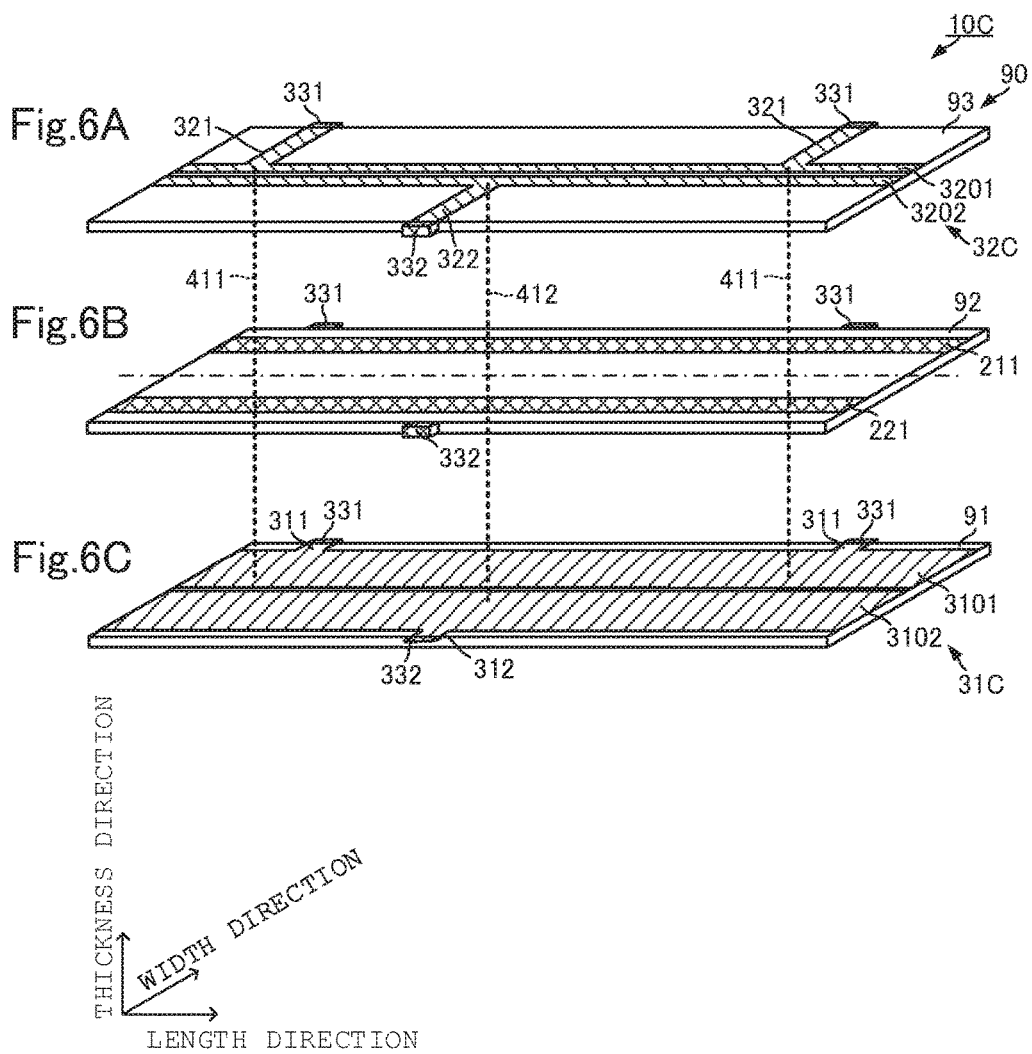

TRANSMISSION LINE

CROSS REFERENCE TO RELATED APPLICATIONS

This application claims the benefit of priority to Japanese Patent Application 2014-113668 filed on Jun. 2, 2014 and is a Continuation Application of PCT/JP2015/064684 filed on May 22, 2015. The entire contents of each of these applications are hereby incorporated herein by reference.

BACKGROUND OF THE INVENTION

1. Field of the Invention

The present invention relates to a transmission line in which signal conductors that transmit high-frequency signals of different frequencies are located close to each other.

2. Description of the Related Art

In the related art, various kinds of transmission lines that transmit high-frequency signals have been developed. For example, a transmission line described in Japanese Patent No. 4962660 has a stripline structure. The transmission line described in Japanese Patent No. 4962660 includes a dielectric base body having an elongated shape, a signal conductor, a first ground conductor, and a second ground conductor. The signal conductor is disposed at a midway position in a thickness direction of the dielectric base body. The signal conductor is included between the first ground conductor and the second ground conductor in the thickness direction of the dielectric base body. The first ground conductor and the second ground conductor are connected to each other by a plurality of via-hole conductors arranged along the signal conductor. The above configuration provides a transmission line having a stripline structure in which the signal conductor is located between the first ground conductor and the second ground conductor.

When a plurality of transmission lines having the configuration described in Japanese Patent No. 4962660 are located close to each other in a device such as a communication device, for example, a plurality of signal conductors are typically arranged in one dielectric base body. Accordingly, the plurality of signal conductors may be spaced apart in a direction perpendicular to the thickness direction of the dielectric base body.

That is, the transmission lines, each including the structure described in Japanese Patent No. 4962660, may be arranged in the direction perpendicular to the thickness direction of the dielectric base body.

As electronic devices to which the transmission line is mounted become smaller, it is desirable to reduce the size of the transmission line. However, if neighboring signal conductors are located close to each other, coupling occurs between the signal conductors. For example, according to the above-described configuration, a distance between the signal conductors decreases if the width of the transmission line is narrowed, which increases coupling between the signal conductors. As a result, isolation between transmission lines including the signal conductors decreases.

SUMMARY OF THE INVENTION

Preferred embodiments of the present invention provide a small transmission line that significantly reduces or prevents coupling between a plurality of transmission lines.

A transmission line according to a preferred embodiment of the present invention includes a dielectric base body, a first signal conductor, a second signal conductor, a first ground conductor, a second ground conductor, a first lateral-surface conductor, and a second lateral-surface conductor. The dielectric base body is a plate including a plurality of dielectric layers stacked on top of one another. The first signal conductor and the second signal conductor are adjacent to or in a vicinity of each other inside the dielectric base body and extend in a transmission direction of a high-frequency signal. The first ground conductor is located on a first side with respect to the first signal conductor and the second signal conductor in a thickness direction of the dielectric base body. The second ground conductor is located on a second side opposite to the first side with respect to the first signal conductor and the second signal conductor in the thickness direction of the dielectric base body.

The first ground conductor overlaps the first signal conductor and the second signal conductor substantially over the entire lengths of the first signal conductor and the second signal conductor when viewed in the thickness direction.

The second ground conductor includes a main conductor portion, a first auxiliary conductor portion, and a second auxiliary conductor portion. The main conductor portion is located between the first signal conductor and the second signal conductor when the plurality of dielectric layers are viewed in the thickness direction and extends along the first signal conductor and the second signal conductor.

The first auxiliary conductor portion is connected to the main conductor portion and extends from the main conductor portion to a first-signal-conductor-side lateral surface. The first-signal-conductor-side lateral surface is a lateral surface of the dielectric base body that extends along the first signal conductor and the second signal conductor and that is located on the first signal conductor side with respect to the main conductor portion.

The second auxiliary conductor portion is connected to the main conductor portion and extends from the main conductor portion to a second-signal-conductor-side lateral surface. The second-signal-conductor-side lateral surface is a lateral surface of the dielectric base body that extends along the first signal conductor and the second signal conductor and that is located on the second signal conductor side with respect to the main conductor portion.

The first lateral-surface conductor connects the first ground conductor and the first auxiliary conductor portion to each other on the first-signal-conductor-side lateral surface.

The second lateral-surface conductor connects the first ground conductor and the second auxiliary conductor portion to each other on the second-signal-conductor-side lateral surface.

The structure according to this preferred embodiment of the present invention simplifies the shape of the second ground conductor and enables the first ground conductor and the second ground conductor to be connected to each other by the first lateral-surface conductor and the second lateral-surface conductor without providing interlayer connection conductors between the first-signal-conductor-side lateral surface of the dielectric base body and the first signal conductor and between the second-signal-conductor-side lateral surface and the second signal conductor. Accordingly, a ground potential of the first ground conductor and the second ground conductor is stabilized, and the width of the dielectric base body, which is a distance between the lateral surfaces of the dielectric base body, is narrowed while maintaining a space between the first signal conductor and the second signal conductor wide when the dielectric layers are viewed in the thickness direction.

In addition, the transmission line according to a preferred embodiment of the present invention preferably includes an interlayer connection conductor connecting the main conductor portion of the second ground conductor and the first ground conductor to each other and extending in the thickness direction of the dielectric base body, for example.

Thus, coupling between the first signal conductor and the second signal conductor is significantly reduced or prevented.

In addition, the transmission line according to a preferred embodiment of the present invention preferably includes a third ground conductor that is located between the main conductor portion and the first ground conductor, extends along the first signal conductor and the second signal conductor, and is connected to the interlayer connection conductor, for example.

Thus, coupling between the first signal conductor and the second signal conductor is significantly reduced or prevented.

In addition, the transmission line according to a preferred embodiment of the present invention preferably includes, for example, the configuration described below. The dielectric base body of the transmission line includes a first concave portion and a second concave portion. The first concave portion is provided at a position which the first auxiliary conductor portion reaches on the first-signal-conductor-side lateral surface and is concave from the first-signal-conductor-side lateral surface. The second concave portion is provided at a position which the second auxiliary conductor portion reaches on the second-signal-conductor-side lateral surface and is concave from the second-signal-conductor-side lateral surface. The first lateral-surface conductor is located at the first concave portion, and the second lateral-surface conductor is located at the second concave portion.

This structure according to a preferred embodiment of the present invention decreases the height of the first lateral-surface conductor protruding from the first-signal-conductor-side lateral surface and the height of the second lateral-surface conductor protruding from the second-signal-conductor-side lateral surface. Accordingly, the width of the transmission line is able to be narrowed. Further, the first and second lateral-surface conductors are easily formed, when compared with first and second lateral-surface conductors provided on the respective lateral surfaces, and damage caused by contact with an external component or the like is significantly reduced or prevented.

In addition, in a transmission line according to a preferred embodiment of the present invention, a position of the first auxiliary conductor portion and a position of the second auxiliary conductor portion are preferably different from each other in a direction in which the first signal conductor and the second signal conductor extend, for example.

Thus, coupling between a first transmission line including the first signal conductor and a second transmission line including the second signal conductor is significantly reduced or prevented.

According to the preferred embodiments of the present invention, transmission lines with reduced size and that significantly reduce or prevent coupling between a plurality of transmission lines are provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is an external perspective view of a transmission line according to a first preferred embodiment of the present invention.

FIGS. 2A to 2C are exploded perspective views illustrating a structure of a major portion of the transmission line according to the first preferred embodiment of the present invention.

FIGS. 5A to 5C are exploded plan views illustrating a structure of a major portion of a transmission line according to a third preferred embodiment of the present invention.

FIGS. 6A to 6C are exploded perspective views illustrating a structure of a major portion of a transmission line according to a fourth preferred embodiment of the present invention.

DETAILED DESCRIPTION OF THE PREFERRED EMBODIMENTS

First Preferred Embodiment

A transmission line according to a first preferred embodiment of the present invention will be described with reference to the drawings. FIG. 1 is an external perspective view of the transmission line according to the first preferred embodiment.

FIGS. 2A to 2C are exploded perspective views illustrating a structure of a major portion of the transmission line according to the first preferred embodiment of the present invention.

Figure 3A:
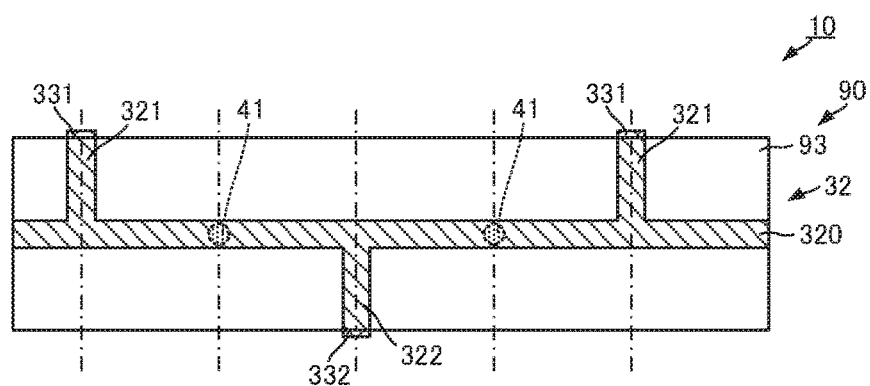
FIGS. 3A to 3C are exploded plan views illustrating the structure of the major portion of the transmission line according to the first preferred embodiment of the present invention.
Figure 3B:
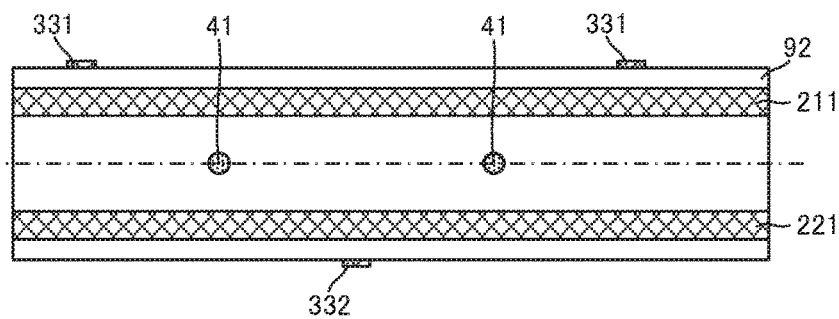
Figure 3C:
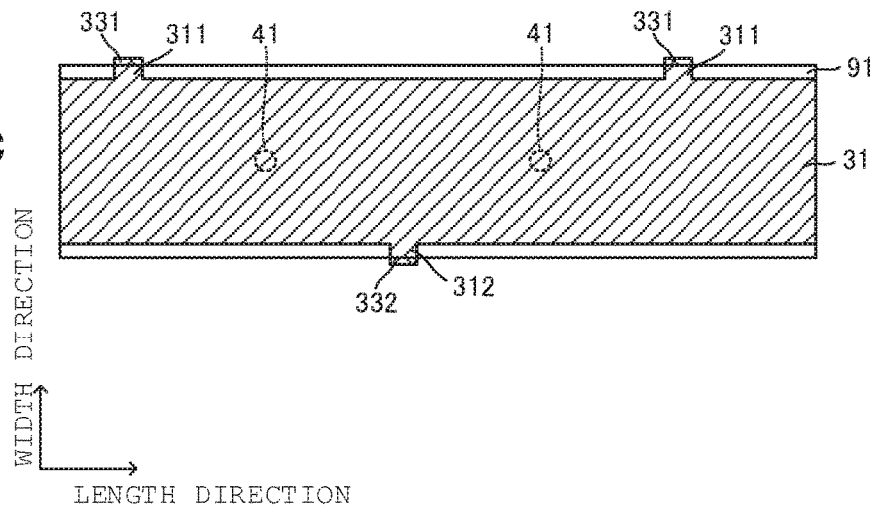

FIGS. 3A to 3C are exploded plan views illustrating the structure of the major portion of the transmission line according to the first preferred embodiment of the present invention.

As illustrated in FIG. 1, a transmission line 10 preferably is elongated and plate-shaped, for example. A length direction of the transmission line 10 corresponds to a transmission direction of a high-frequency signal. A direction parallel to a plate surface and perpendicular to the length direction is a width direction of the transmission line 10.

The transmission line 10 includes a dielectric base body 90 that preferably is elongated and plate-shaped, for example. The dielectric base body 90 includes a plurality of dielectric layers 91, 92, and 93 stacked on top of one another. The transmission line 10 includes a major portion and extending portions connected to respective ends of the major portion in the length direction. The major portion of the transmission line 10 includes a first transmission line with a first signal conductor 211 and a second transmission line with a second signal conductor 221, which are provided together in the dielectric base body 90.

Each of the extending portions of the transmission line 10 includes either the first transmission line or the second transmission line. Each of the extending portions includes a stripline or microstripline structure.

An external connection terminal 511 including a connector member is connected to the extending portion at one end of the first transmission line. An external connection terminal 512 including a connector member is connected to the extending portion at the other end of the first transmission line. An external connection terminal 521 including a connector member is connected to the extending portion at one end of the second transmission line. An external connection terminal 522 including a connector member is connected to the extending portion at the other end of the second transmission line.

The dielectric base body 90 includes a principal surface to which the external connection terminals 511, 512, 521, and 522 are connected, and an insulating resist film 60 is included on the principal surface. The resist film 60 protects conductor patterns exposed on the surface of the dielectric base body 90 from the outside environment.

The structure of the major portion of the transmission line 10 is described in more detail below. As illustrated in FIGS. 2A to 2C and FIGS. 3A to 3C, the dielectric base body 90 includes the plurality of dielectric layers 91, 92, and 93, which are elongated and are stacked on top of one another. The plurality of dielectric layers 91, 92, and 93 include a thermoplastic resin. Specifically, the plurality of dielectric layers 91, 92, and 93 include, for example, a material such as liquid crystal polymer or polyimide. The dielectric layers 91, 92, and 93 are stacked and press-bonded by heat to define the dielectric base body 90.

A first ground conductor 31 is included on a surface of the dielectric layer 91, specifically, a surface of the dielectric layer 91 closer to the dielectric layer 92. The first ground conductor 31 is provided over substantially the entire surface of the dielectric layer 91. However, a width of the first ground conductor 31 is narrower than a width of the dielectric layer 91, that is, a narrower width than the dielectric base body 90. Accordingly, the first ground conductor 31 is not included at both ends of the dielectric layer 91 in the width direction of the dielectric layer 91, that is, in regions of a predetermined width from respective lateral surfaces of the dielectric base body 90.

A plurality of conductors 311 connected by plating (hereinafter, referred to as plating-connection conductors 311) are located on a first-lateral-surface-side region of the surface of the dielectric layer 91 where the first ground conductor 31 is not included. One end of each of the plurality of plating-connection conductors 311 is connected to the first ground conductor 31 and the other end of each of the plurality of plating-connection conductors 311 reaches a first lateral surface on the surface of the dielectric layer 91. The plurality of plating-connection conductors 311 are spaced apart in the length direction of the dielectric layer 91, which corresponds to a length direction of the dielectric base body 90.

A plurality of conductors 312 connected by plating (hereinafter, referred to as plating-connection conductors 312) are located on a second-lateral-surface-side region of the surface of the dielectric layer 91 where the first ground conductor 31 is not included. One end of each of the plurality of plating-connection conductors 312 is connected to the first ground conductor 31 and the other end of each of the plurality of plating-connection conductors 312 reaches a second lateral surface on the surface of the dielectric layer 91. The plurality of plating-connection conductors 312 are spaced apart in the length direction of the dielectric layer 91, which corresponds to the length direction of the dielectric base body 90.

The positions of the plurality of plating-connection conductors 312 differ from the positions of the plurality of plating-connection conductors 311 in the length direction of the dielectric layer 91, which corresponds to the length direction of the dielectric base body 90. In addition, the plating-connection conductors 312 and the plating-connection conductors 311 are alternately included in the length direction of the dielectric layer 91, which corresponds to the length direction of the dielectric base body 90.

According to a modification of the first preferred embodiment of the present invention, the first ground conductor 31 may be provided over the surface of the dielectric layer 91 without including the plating-connection conductors 311 and 312. However, by including the plating-connection conductors 311 and 312, exposure of the first ground conductor 31 to outside from the first lateral surface and the second lateral surface is significantly reduced or prevented. Accordingly, unwanted contact between an external conductor pattern and the first ground conductor 31 is significantly reduced or prevented. In addition, since current is concentrated at positions where lateral-surface conductors 331 and 332 are desired while the lateral-surface conductors 331 and 332 are being formed, the lateral-surface conductors 331 and 332 are able to be efficiently provided by electroplating, for example.

The first signal conductor 211 and the second signal conductor 221 are provided on a surface of the dielectric layer 92. Specifically, the first signal conductor 211 and the second signal conductor 221 are provided on a surface of the dielectric layer 92 closer to the dielectric layer 93. Each of the first signal conductor 211 and the second signal conductor 221 is a line-shaped conductor that extends in the length direction of the dielectric layer 92. The first signal conductor 211 and the second signal conductor 221 are spaced apart in the width direction of the dielectric layer 92, which corresponds to a width direction of the dielectric base body 90.

The first signal conductor 211 is located on the first lateral surface side with respect to the central position in the width direction of the dielectric layer 92. Specifically, the first signal conductor 211 is located at a position that overlaps the first ground conductor 31 in the thickness direction in the dielectric base body 90. In addition, the first signal conductor 211 is preferably located at a position closer to the first lateral surface than to the central position and is more preferably located as close as possible to the first lateral surface, with respect to a predetermined impedance or the like of the first transmission line, for example.

The second signal conductor 221 is located on the second lateral surface side with respect to the central position in the width direction of the dielectric layer 92. Specifically, the second signal conductor 221 is located at a position that overlaps the first ground conductor 31 in the thickness direction in the dielectric base body 90. In addition, the second signal conductor 221 is preferably located at a position closer to the second lateral surface than to the central portion and is more preferably located as close as possible to the second lateral surface, with respect to a predetermined impedance or the like of the second transmission line, for example.

A second ground conductor 32 is included on a surface of the dielectric layer 93. Specifically, the second ground conductor 32 is included on a surface of the dielectric layer 93 opposite to the dielectric layer 92. The second ground conductor 32 includes a main conductor portion 320, a first auxiliary conductor portion 321, and a second auxiliary conductor portion 322.

The main conductor portion 320 is a line-shaped conductor extending in the length direction of the dielectric layer 93. The main conductor portion 320 is located at a position that overlaps neither the first signal conductor 211 nor the second signal conductor 221 when viewed in the thickness direction of the dielectric base body 90. The main conductor portion 320 is located at a position between the first signal conductor 211 and the second signal conductor 221 in the width direction of the dielectric base body 90. Preferably, the main conductor portion 320 is located at a position that is equal or substantially equal distance from the first signal conductor 211 and the second signal conductor 221 in the width direction of the dielectric base body 90, that is, at or substantially at a central position between the first signal conductor 211 and the second signal conductor 221.

The first auxiliary conductor portion 321 is a line-shaped conductor extending in the width direction of the dielectric layer 93. One end of the first auxiliary conductor portion 321 is connected to the main conductor portion 320, and the other end of the first auxiliary conductor portion 321 reaches the first lateral surface on the surface of the dielectric layer 93. A plurality of first auxiliary conductor portions 321 are spaced apart in the length direction of the dielectric layer 93, which corresponds to the length direction of the dielectric base body 90. The positions of the respective first auxiliary conductor portions 321 in the length direction of the dielectric layer 93 are the same or substantially the same as the respective positions of the corresponding plating-connection conductors 311 in the length direction of the dielectric layer 91. That is, each of the plurality of first auxiliary conductor portions 321 overlaps a corresponding one of the plurality of plating-connection conductors 311 in the dielectric base body 90.

The second auxiliary conductor portion 322 is a line-shaped conductor extending in the width direction of the dielectric layer 93. One end of the second auxiliary conductor portion 322 is connected to the main conductor portion 320, whereas the other end of the second auxiliary conductor portion 322 reaches the second lateral surface on the surface of the dielectric layer 93. A plurality of second auxiliary conductor portions 322 are spaced apart in the length direction of the dielectric layer 93, which corresponds to the length direction of the dielectric base body 90.

The positions of the plurality of second auxiliary conductor portions 322 differ from the positions of the plurality of first auxiliary conductor portions 321 in the length direction of the dielectric layer 93, which corresponds to the length direction of the dielectric base body 90. In addition, the second auxiliary conductor portions 322 and the first auxiliary conductor portions 321 are alternately included in the length direction of the dielectric layer 93, which corresponds to the length direction of the dielectric base body 90. The positions of the respective second auxiliary conductor portions 322 in the length direction of the dielectric layer 93 are the same or substantially the same as the respective positions of the corresponding plating-connection conductors 312 in the length direction of the dielectric layer 91. That is, each of the plurality of second auxiliary conductor portions 322 overlaps a corresponding one of the plurality of plating-connection conductors 312 in the dielectric base body 90, which includes the dielectric layers 91, 92, and 93 stacked on top of one another.

The plurality of lateral-surface conductors 331 are provided on the first lateral surface of the dielectric base body 90. Each of the lateral-surface conductors 331 is provided for a corresponding set of the first auxiliary conductor portion 321 and the plating-connection conductor 311 and connects the first auxiliary conductor portion 321 and the plating-connection conductor 311 to each other.

The plurality of lateral-surface conductors 332 are provided on the second lateral surface of the dielectric base body 90. Each of the lateral-surface conductors 332 is provided for a corresponding set of the second auxiliary conductor portion 322 and the plating-connection conductor 312 and connects the second auxiliary conductor portion 322 and the plating-connection conductor 312 to each other.

A plurality of interlayer connection conductors 41 are included in the dielectric base body 90. Each of the plurality of interlayer connection conductors 41 penetrates through the dielectric layers 92 and 93 and connects the main conductor portion 320 of the second ground conductor 32 and the first ground conductor 31 to each other. The plurality of interlayer connection conductors 41 are defined at positions different from those of the first auxiliary conductor portions 321, the plating-connection conductors 311, the second auxiliary conductor portions 322, and the plating-connection conductors 312, in the length direction of the dielectric base body 90. More specifically, the plurality of interlayer connection conductors 41 are located at middle or substantially at middle positions each between the position of the corresponding first auxiliary conductor portion 321 and the corresponding plating-connection conductor 311 and the position of the corresponding second auxiliary conductor portion 322 and the corresponding plating-connection conductor 312, in the length direction of the dielectric base body 90. Preferably, the position of each of the plurality of interlayer connection conductors 41 is a middle position between the position of the corresponding first auxiliary conductor portion 321 and the corresponding plating-connection conductor 311 and the position of the corresponding second auxiliary conductor portion 322 and the corresponding plating-connection conductor 312, for example.

Accordingly, the first and second transmission lines are provided in the dielectric base body 90.

The first transmission line includes the first signal conductor 211, the first ground conductor 31, and the main conductor portion 320 and the first auxiliary conductor portion 321 of the second ground conductor 32. A stripline transmission line is provided in which the first signal conductor 211 is located between the two ground conductors in the thickness direction and one of the ground conductors includes an opening. The first ground conductor 31 and the second ground conductor 32 are connected to each other by the lateral-surface conductors 331, the plating-connection conductors 311, and the interlayer connection conductors 41. Accordingly, the ground of the first transmission line is able to be stabilized.

Impedance of the first transmission line is determined as described below. The shapes of the first signal conductor 211 and the first ground conductor 31 are determined so that the first signal conductor 211 and the first ground conductor 31 preferably set an impedance of the first transmission line to approximately 55 $\Omega$, which is slightly higher than 50 $\Omega$, for example. Also, the shapes of the main conductor portion 320 and the first auxiliary conductor portions 321 of the second ground conductor 32 are determined so that the main conductor portion 320 and the first auxiliary conductor portions 321 set the characteristic impedance of the first transmission line to about 50 $\Omega$, for example.

The second transmission line includes the second signal conductor 221, the first ground conductor 31, and the main conductor portion 320 and the second auxiliary conductor portion 322 of the second ground conductor 32. A stripline transmission line is defined in which the second signal conductor 221 is located between the two ground conductors in the thickness direction and one of the ground conductors includes an opening. The first ground conductor 31 and the second ground conductor 32 are connected to each other by the lateral-surface conductors 332, the plating-connection conductors 312, and the interlayer connection conductors 41. Accordingly, the ground of the second transmission line is able to be stabilized.

Impedance of the second transmission line is determined as described below. The shapes of the second signal conductor 221 and the first ground conductor 31 are determined so that the second signal conductor 221 and the first ground conductor 31 preferably set impedance of the second transmission line to approximately 55 Ω, which is slightly higher than 50 Ω, for example. Also, the shapes of the main conductor portion 320 and the second auxiliary conductor portions 322 of the second ground conductor 32 are determined so that the main conductor portion 320 and the second auxiliary conductor portions 322 set the characteristic impedance of the second transmission line to about 50 Ω, for example.

According to the first preferred embodiment, it is not necessary to provide interlayer connection conductors between the first signal conductor 211 and the first lateral surface and between the second signal conductor 221 and the second lateral surface inside the dielectric base body 90. Accordingly, the width of the dielectric base body 90, that is, the width of the major portion of the transmission line 10, is narrowed while maintaining the space between the first signal conductor 211 and the second signal conductor 221 wide. Accordingly, the transmission line 10 significantly reduces or prevents coupling between the first signal conductor 211 and the second signal conductor 221 while being provided with a relatively small size.

Further, the transmission line 10 according to the first preferred embodiment includes the plurality of interlayer connection conductors 41 that connect the main conductor portion 320 of the second ground conductor 32 and the first ground conductor 31 to each other. Thus, coupling between the first signal conductor 211 and the second signal conductor 221 is significantly reduced or prevented. According to a modification of the first preferred embodiment, some or all of the interlayer connection conductors 41 may be omitted; however, it is preferable that the interlayer connection conductors 41 are provided as described in the first preferred embodiment.

The positions of the first auxiliary conductor portions 321 and the interlayer connection conductors 41 in the length direction of the dielectric base body 90 differ from each other. Thus, coupling between the first signal conductor 211 and the second signal conductor 221 is significantly reduced or prevented.

The positions of the first auxiliary conductor portions 321 and the second auxiliary conductor portions 322 in the length direction of the dielectric base body 90 are different from each other. Thus, coupling between the first transmission line and the second transmission line via an opening on the second ground conductor 32 side, that is, a region where the first auxiliary conductor portions 321 or the second auxiliary conductor portions 322 are not included, is significantly reduced or prevented. If coupling via the opening or coupling between the first signal conductor 211 and the second signal conductor 221 is small, for example, due to a low power transmitted signal or the like, the positions of the first auxiliary conductor portions 321 and the second auxiliary conductor portions 322 in the length direction of the dielectric base body 90 may be the same or substantially the same. In addition, the positions of the first auxiliary conductor portions 321 and the second auxiliary conductor portions 322 in the length direction of the dielectric base body 90 may also be the same or substantially the same as the positions of the interlayer connection conductors 41.

The transmission line 10 including the above-described structure may be fabricated, for example, as described below.

First to third dielectric films, corresponding to the dielectric layers 91 to 93, are prepared. One side of each of the first to third dielectric films includes copper cladding over the entire surface. In the first preferred embodiment, a liquid crystal polymer is preferably included as the dielectric films, for example.

The first ground conductor 31 and the plating-connection conductors 311 and 312 are provided on a surface of the first dielectric film, corresponding to the dielectric layer 91. The first ground conductor 31 and the plating-connection conductors 311 and 312 are provided, for example, by processing such as patterning. The first signal conductor 211 and the second signal conductor 221 are provided on a surface of the second dielectric film, corresponding to the dielectric layer 92. The first signal conductor 211 and the second signal conductor 221 are provided, for example, by processing such as patterning. The second ground conductor 32 including the main conductor portion 320, the first auxiliary conductor portions 321, and the second auxiliary conductor portions 322 are provided on a surface of the third dielectric film, corresponding to the dielectric layer 93. The second ground conductor 32 including the main conductor portion 320, the first auxiliary conductor portions 321, and the second auxiliary conductor portions 322 are formed, for example, by processing such as patterning.

Then, predetermined positions of the plurality of dielectric films are irradiated with a laser beam to form through holes. The through holes are then filled with conductive paste to provide conductor portions from which the interlayer connection conductors 41 are form.

Then, the plurality of dielectric films are stacked and press-bonded by heat to define an integrated structure. The integrated structure is then cut into individual pieces, each of which is the dielectric base body 90. During this process, the conductive paste solidifies, and consequently the interlayer connection conductors 41 are formed.

Then, electroplating is performed to connect the first and second auxiliary conductor portions 321 and 322 to the plating-connection conductors 311 and 312, respectively. Accordingly, the lateral-surface conductors 331 and 332 are formed.

Finally, the external connection terminals 511, 512, 521, and 522 are mounted at the respective extending portions located at respective ends of the dielectric base body 90 in the length direction.

Second Preferred Embodiment

Figure 4A:
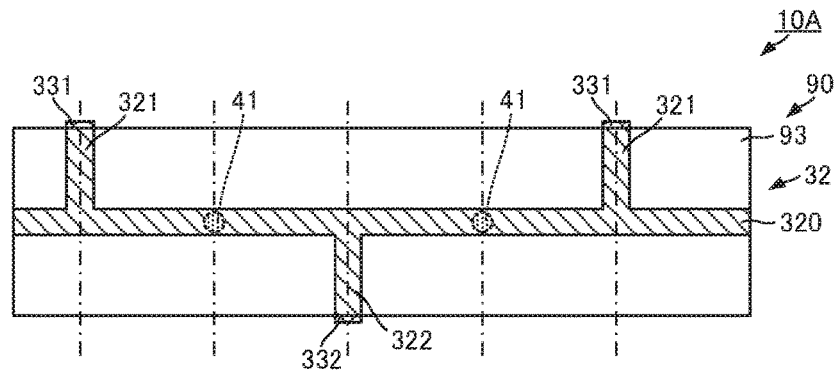
FIGS. 4A to 4C are exploded plan views illustrating a structure of a major portion of a transmission line according to a second preferred embodiment of the present invention.
Figure 4B:
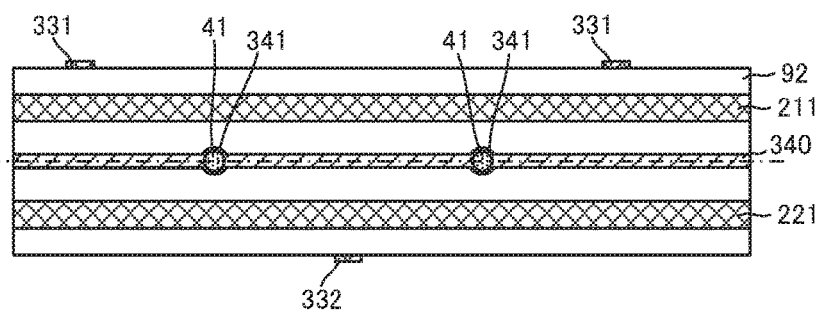
Figure 4C:
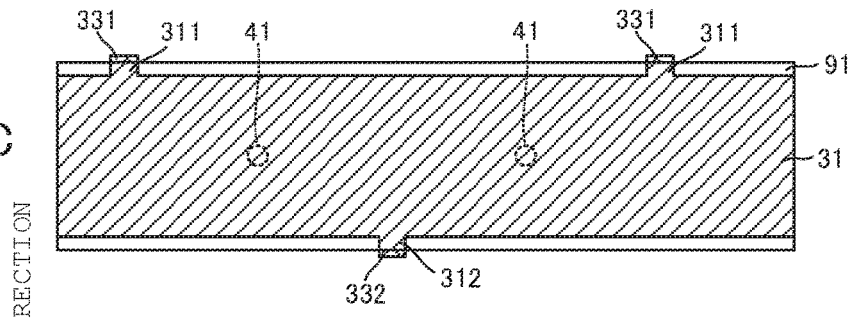

A transmission line according to a second preferred embodiment of the present invention is described below with reference to the drawings. FIGS. 4A to 4C are exploded plan views illustrating a structure of a major portion of the transmission line according to the second preferred embodiment.

A transmission line 10A according to the second preferred embodiment includes a third ground conductor 340 added to the transmission line 10 according to the first preferred embodiment. The remaining features of the transmission line 10 according to the second preferred embodiment are the same or substantially the same as the transmission line 10 according to the first preferred embodiment.

The third ground conductor 340 is included on a surface of the dielectric layer 92. The third ground conductor 340 is a line-shaped conductor extending in the length direction of the dielectric layer 92, which corresponds to the length direction of the dielectric base body 90. The third ground conductor 340 is located between the first signal conductor 211 and the second signal conductor 221 in the width direction of the dielectric layer 92, which corresponds to the width direction of the dielectric base body 90. The third ground conductor 340 is parallel or substantially parallel to the first signal conductor 211 and the second signal conductor 221.

The third ground conductor 340 is connected to the plurality of interlayer connection conductors 41. Preferably, the third ground conductor 340 includes a width narrower than the widths of the first and second signal conductors 211 and 221 except for portions connected to the interlayer connection conductors 41. Accordingly, the third ground conductor 340 partially includes wide conductor portions 341 at the portions connected to the interlayer connection conductors 41.

According to the second preferred embodiment, coupling between the first signal conductor 211 and the second signal conductor 221 is significantly reduced or prevented. In addition, by defining the third ground conductor 340 to include a narrow width, coupling between the third ground conductor 340 and the first and second signal conductors 211 and 221 is significantly reduced or prevented and impedances of the first transmission line and the second transmission line are able to be set to desired impedances while maintaining a narrow width of the dielectric base body 90.

Third Preferred Embodiment

A transmission line according to a third preferred embodiment of the present invention is described below with reference to the drawings. FIGS. 5A to 5C are exploded plan views illustrating a structure of a major portion of the transmission line according to the third preferred embodiment.

A transmission line 10B according to the third preferred embodiment includes first auxiliary conductor portions 321B, second auxiliary conductor portions 322B, plating-connection conductors 311B and 312B, and first and second signal conductors 211B and 221B that are configured differently from the corresponding components of the transmission line 10 according to the first preferred embodiment. The transmission line 10B according to the third preferred embodiment also includes lateral-surface conductors 331B and 332B that are configured differently from the corresponding components of the transmission line 10 according to the first preferred embodiment. The remaining features of the transmission line 10 according to the second preferred embodiment are the same or substantially the same as the transmission line 10 according to the first preferred embodiment.

Concave portions are concave from the first lateral surface are provided at the dielectric layers 91, 92, and 93, specifically, at positions where the first auxiliary conductor portions 321B and the plating-connection conductors 311B are provided on the first lateral surface of the dielectric base body 90. Each of the lateral-surface conductors 331B includes at least a wall of a corresponding one of the concave portions.

Concave portions are concave from the second lateral surface are provided at the dielectric layers 91, 92, and 93, specifically, at positions where the second auxiliary conductor portions 322B and the plating-connection conductors 312B are provided on the second lateral surface of the dielectric base body 90. Each of the lateral-surface conductors 332B includes at least a wall of a corresponding one of the concave portions.

According to the third preferred embodiment, the heights of the lateral-surface conductors 331B and 332B protruding from the respective lateral surfaces of the dielectric base body 90 are decreased with respect to the first and second preferred embodiments. Accordingly, the transmission line 10B includes a narrower width than the transmission line 10 of the first preferred embodiment and the transmission line 10A of the second preferred embodiment. In addition, as a result of the lateral-surface conductors 331B and 332B being located at the concave portions, damage of the lateral-surface conductors 331B and 332B by external force is significantly reduced or prevented even more than the configuration in which the lateral-surface conductors are provided only along the lateral surfaces of the dielectric base body 90. Thus, the third preferred embodiment provides a highly reliable transmission line. Further, since external forces are not directly applied to the lateral-surface conductors 331B and 332B if the lateral-surface conductors 331B and 332B are only located at the concave portions, a highly reliable transmission line is provided. In addition, unwanted short-circuiting may be significantly reduced or prevented with an external circuit via the lateral-surface conductors 331B and 332B.

Further, in the third preferred embodiment, the first signal conductor 211B includes curved portions 212B at positions of the lateral-surface conductors 331B in the length direction of the dielectric base body 90. The curved portions 212B each include a structure that is partially curved toward the center of the dielectric base body 90 relative to the remaining portion of the first signal conductor 211B. Accordingly, the first signal conductor 211B and the lateral-surface conductors 331B are spaced apart, and a desired impedance of the first transmission line is able to be achieved.

In addition, in the third preferred embodiment, the second signal conductor 221B includes curved portions 222B at positions of the lateral-surface conductors 332B in the length direction of the dielectric base body 90. The curved portions 222B each include a structure that is partially curved toward the center of the dielectric base body 90 relative to the remaining portion of the second signal conductor 221B. Accordingly, the second signal conductor 221B and the lateral-surface conductors 332B are spaced apart, and a desired impedance of the second transmission line is able to be provided.

Furthermore, in the third preferred embodiment, the positions of the curved portions 212B of the first signal conductor 211B differ from the positions of the curved portions 222B of the second signal conductor 221B in the length direction of the dielectric base body 90. Thus, coupling between the first signal conductor 211B and the second signal conductor 221B is significantly reduced or prevented even more than if the positions of the curved portions 212B and 222B are the same or substantially the same.

Fourth Preferred Embodiment

A transmission line according to a fourth preferred embodiment of the present invention is described below with reference to the drawings. FIGS. 6A to 6C are exploded perspective views illustrating a structure of a major portion of the transmission line according to the fourth preferred embodiment.

A transmission line 10C according to the fourth preferred embodiment includes a first ground conductor 31C and a second ground conductor 32C structured differently from the corresponding components of the transmission line 10 according to the first preferred embodiment.

The first ground conductor 31C includes a ground conductor 3101 for the first signal conductor (hereinafter, referred to as a first-signal-conductor ground conductor 3101) and a ground conductor 3102 for the second signal conductor (hereinafter, referred to as a second-signal-conductor ground conductor 3102). The first-signal-conductor ground conductor 3101 is provided over a half or substantially a half of the surface of the dielectric layer 91 on the first signal conductor 211 side in the width direction. The second-signal-conductor ground conductor 3102 is provided over a half or substantially a half of the surface of the dielectric layer 91 on the second signal conductor 221 side in the width direction. In other words, the first-signal-conductor ground conductor 3101 and the second-signal-conductor ground conductor 3102 are defined by halving the first ground conductor 31 according to the first preferred embodiment at or substantially at the center in the width direction of the dielectric layer 91.

The second ground conductor 32C includes main conductor portions 3201 and 3202. The main conductor portion 3201 is located at or substantially at the center in the width direction of the dielectric layer 93 and is on the first signal conductor 211 side. The main conductor portion 3201 does not overlap the first signal conductor 211 in the dielectric base body 90. The main conductor portion 3202 is located at or substantially at the center in the width direction of the dielectric layer 93 and is on the second signal conductor 221 side. The main conductor portion 3202 does not overlap the second signal conductor 221 in the dielectric base body 90. In other words, the main conductor portions 3201 and 3202 are defined by halving the main conductor portion 320 according to the first preferred embodiment at or substantially at the center in the width direction of the dielectric layer 93.

The main conductor portion 3201 is connected to the first-signal-conductor ground conductor 3101 by interlayer connection conductors 411. The main conductor portion 3202 is connected to the second-signal-conductor ground conductor 3102 by interlayer connection conductors 412.

The fourth preferred embodiment provides advantages similar to those of the first through third preferred embodiments. Further, since the ground conductors are separated for individual transmission lines in the fourth preferred embodiment, isolation is able to be further enhanced between the transmission lines.

Although an example of the dielectric base body 90 including two signal conductors is described in each of the first through fourth preferred embodiments, the preferred embodiments of the present invention are able to be applied to a dielectric base body that includes three or more signal conductors. That is, the first through fourth preferred embodiments are able to be applied to a signal conductor closest to the first lateral surface and a signal conductor closest to the second lateral surface in the width direction of the dielectric base body 90. In addition, according to a modification of the first through fourth preferred embodiments, the main conductor portions of the second ground conductor described above are each located between corresponding adjacent signal conductors, and signal conductors other than the signal conductors closest to the respective lateral surfaces described above are each located between adjacent main conductor portions in the width direction of the dielectric base body 90. Accordingly, the main conductor portions are able to be connected by a bridge conductor extending in the width direction of the dielectric base body 90.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line comprising:
    a dielectric base body that includes a plurality of dielectric layers stacked on top of one another;
    a first signal conductor and a second signal conductor that are adjacent to or in a vicinity of each other inside the dielectric base body and that extend in a transmission direction of a high-frequency signal;
    a first ground conductor located on a first side with respect to the first signal conductor and the second signal conductor in a thickness direction of the dielectric base body, the first ground conductor overlapping the first signal conductor and the second signal conductor over substantially entire lengths of the first signal conductor and the second signal conductor when viewed in the thickness direction;
    a second ground conductor located on a second side opposite to the first side with respect to the first signal conductor and the second signal conductor in the thickness direction of the dielectric base body, the second ground conductor including:
    a main conductor portion located between the first signal conductor and the second signal conductor when the plurality of dielectric layers are viewed in the thickness direction and extending along the first signal conductor and the second signal conductor;
    a first auxiliary conductor portion connected to the main conductor portion and extending from the main conductor portion to a first-signal-conductor-side lateral surface of the dielectric base body, the first-signal-conductor-side lateral surface extending along the first signal conductor and the second signal conductor; and
    a second auxiliary conductor portion connected to the main conductor portion and extending from the main conductor portion to a second-signal-conductor-side lateral surface of the dielectric base body, the second-signal-conductor-side lateral surface extending along the first signal conductor and the second signal conductor;
    a first lateral-surface conductor connecting the first ground conductor and the first auxiliary conductor portion to each other on the first-signal-conductor-side lateral surface; and
    a second lateral-surface conductor connecting the first ground conductor and the second auxiliary conductor portion to each other on the second-signal-conductor-side lateral surface.

2. The transmission line according to claim 1, further comprising:
    an interlayer connection conductor connected to the main conductor portion of the second ground conductor and to the first ground conductor and extending in the thickness direction of the dielectric base body.

3. The transmission line according to claim 2, further comprising:
    a third ground conductor located between the main conductor portion and the first ground conductor; wherein the third ground conductor extends along the first signal conductor and the second signal conductor and connects to the interlayer connection conductor.

4. The transmission line according to claim 2, wherein the interlayer connection conductor is located at a position different from the first auxiliary conductor portion and the second auxiliary conductor portion.

5. The transmission line according to claim 4, wherein the interlayer connection conductor is located at or substantially at a middle position between the first auxiliary conductor portion and the second auxiliary conductor portion.

6. The transmission line according to claim 1, wherein the dielectric base body includes:
  a first concave portion located at a position to which the first auxiliary conductor portion extends on the first-signal-conductor-side lateral surface; and
  a second concave lateral surface portion located at a position to which the second auxiliary conductor portion extends on the second-signal-conductor-side lateral surface; wherein
  the first lateral-surface conductor is concave from the first-signal-conductor-side lateral surface;
  the second lateral-surface conductor is concave from the second-signal-conductor-side lateral surface;
  the first lateral-surface conductor is located at the first concave portion; and
  the second lateral-surface conductor is located at the second concave portion.

7. The transmission line according to claim 1, wherein the first auxiliary conductor portion and the second auxiliary conductor portion are located at different positions from each other in a direction in which the first signal conductor and the second signal conductor extend.

8. The transmission line according to claim 1, further comprising:
  a first external connection terminal connected to an extending portion of the first signal conductor; and
  a second external connection terminal connected to an extending portion of the second signal conductor.

9. The transmission line according to claim 1, further comprising:
  an insulating resist film included on a principal surface of the dielectric base body.

10. The transmission line according to claim 1, wherein the plurality of dielectric layers include at least three layers stacked on top of one another.

11. The transmission line according to claim 1, wherein the plurality of dielectric layers include a thermoplastic resin.

12. The transmission line according to claim 1, wherein a width of the first ground conductor is narrower than a width of the dielectric base body.

13. The transmission line according to claim 1, wherein a characteristic impedance of the transmission line is about 50 Ω.

14. The transmission line according to claim 1, further comprising a third signal conductor located between the first signal conductor and the second signal conductor.

* * * * *